US009070439B2

(12) United States Patent
Gammel et al.

(10) Patent No.: US 9,070,439 B2
(45) Date of Patent: Jun. 30, 2015

(54) ELECTRONIC DEVICE WITH A PROGRAMMABLE RESISTIVE ELEMENT AND A METHOD FOR BLOCKING A DEVICE

(75) Inventors: Berndt Gammel, Markt-Schwaben (DE); Thomas Nirschl, Putzbrunn (DE); Gerd Dirscherl, Munich (DE); Philip Schlazer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 243 days.

(21) Appl. No.: 13/426,019

(22) Filed: Mar. 21, 2012

(65) Prior Publication Data

US 2012/0176833 A1 Jul. 12, 2012

Related U.S. Application Data

(63) Continuation of application No. 12/563,427, filed on Sep. 21, 2009, now Pat. No. 8,159,857.

(51) Int. Cl.
*G11C 11/00* (2006.01)
*G11C 13/00* (2006.01)

(52) U.S. Cl.
CPC ........ *G11C 13/0059* (2013.01); *G11C 13/0004* (2013.01)

(58) Field of Classification Search
CPC ........... G11C 13/0004; G11C 13/0069; G11C 13/004; G11C 13/0064; G11C 3/0002; G11C 13/003; G11C 11/5678; G11C 2213/15; G11C 16/10
USPC ............... 365/148, 163, 189.16, 185.03, 154, 365/185.33, 46, 131
See application file for complete search history.

(56) References Cited

U.S. PATENT DOCUMENTS

| | | |
|---|---|---|
| 5,694,054 A | 12/1997 | Ovshinsky et al. |
| 6,189,582 B1 | 2/2001 | Reinberg et al. |
| 7,706,167 B2 | 4/2010 | Toda et al. .................... 365/148 |
| 2004/0240273 A1 | 12/2004 | Sakui |
| 2004/0252544 A1 | 12/2004 | Lowrey et al. |
| 2005/0127349 A1 | 6/2005 | Horak et al. ....................... 257/3 |
| 2006/0097240 A1 | 5/2006 | Lowrey et al. |
| 2006/0097343 A1 | 5/2006 | Parkinson |
| 2006/0171194 A1 | 8/2006 | Lowrey et al. |
| 2007/0212868 A1 | 9/2007 | Sahasrabudhe et al. ...... 438/613 |

(Continued)

OTHER PUBLICATIONS

D. Tio Castro et al.; "Evidence of the Thermo-Electric Thomson Effect and Influence on the Program Conditions and Cell Optimization in Phase-Chnage Memory Cells"; IEDM 2007, Paper 12.5, pp. 315-318.

(Continued)

*Primary Examiner* — Son Dinh
*Assistant Examiner* — Uyen B Tran
(74) *Attorney, Agent, or Firm* — Schiff Hardin LLP

(57) ABSTRACT

One or more embodiments relate to an electronic device comprising a circuitry and a programmable resistive element. The programmable resistive element comprises a first and a second state, wherein the programmable resistive element is configured to allow switching from the second state into the first state in response to a signal comprising at least a predefined level. The circuitry is configured to provide signals up the predefined level, wherein the circuitry is configured to provide a switch signal to the programmable resistive element, wherein the switch signal causes switching from the first into the second state.

12 Claims, 5 Drawing Sheets

(56) References Cited

U.S. PATENT DOCUMENTS

| | | |
|---|---|---|
| 2008/0084738 A1 | 4/2008 | Philipp et al. ............ 365/185.03 |
| 2008/0192531 A1 | 8/2008 | Tamura et al. ................ 365/148 |
| 2008/0211539 A1 | 9/2008 | Parkinson |
| 2008/0298121 A1 | 12/2008 | Otterstedt et al. ............ 365/163 |
| 2009/0168504 A1 | 7/2009 | Lee et al. ...................... 365/163 |

OTHER PUBLICATIONS

Kenneth E. Van Landingham; "Circuit Applications of Ovonic Switching Devices"; IEEE Transactions on Electron Devices, vol. Ed-20, No. 2, Feb. 1973.

ELECTRONIC DEVICE WITH A PROGRAMMABLE RESISTIVE ELEMENT AND A METHOD FOR BLOCKING A DEVICE

CROSS REFERENCE TO RELATED APPLICATION

This application is a continuation of U.S. patent application Ser. No. 12/563,427, which was filed Sep. 21, 2009. This application is incorporated herein by reference in its entirety.

BACKGROUND

Embodiments of the present invention relate to an electronic device with a programmable resistive element. Further embodiments relate to an electronic device with a phase change memory element. Yet other embodiments relate to an electronic device with an asymmetric phase-change memory cell.

There is a need for a fast programmable non-volatile memory cell comprising an irreversible state, wherein the one or more irreversible states may physically be irreversible, and a programming speed should be especially high.

SUMMARY

Embodiments of the present invention relate to an electronic device comprising a circuitry and a programmable resistive element. The programmable resistive element comprises at least a first and a second state, wherein the programmable resistive element is configured to allow switching from the second state into the first state in response to a signal comprising at least a predefined level. The circuitry is configured to provide signals below the predefined level, wherein the circuitry is configured to provide a switch signal to the programmable resistive element, wherein the switch signal causes switching from the first into the second state.

BRIEF DESCRIPTION OF THE DRAWINGS

Embodiments of the present invention will be explained in the following with reference to the accompanying drawings, in which.

Before embodiments of the present invention are explained in greater detail on the basis of the drawings in the following, it is to be pointed out that like elements in the figures are provided with the same or similar reference numerals, and that a repeated description of these elements is omitted.

DETAILED DESCRIPTION OF THE INVENTION

Figure 1:
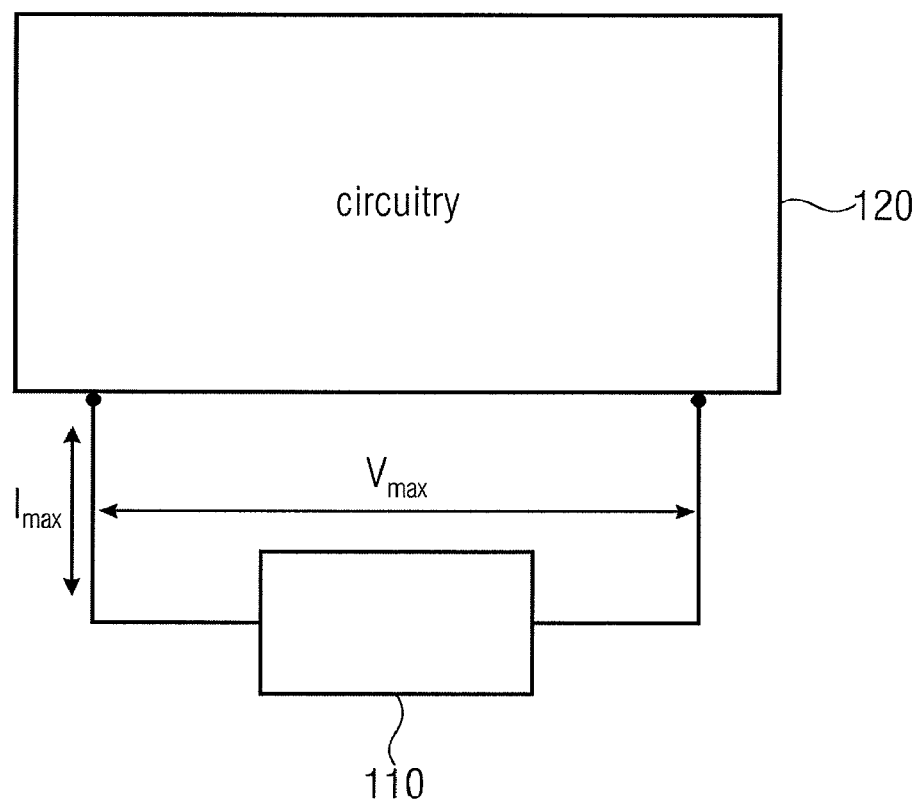
FIG. 1 shows a schematic view of the electronic device according to an embodiment of the present invention.

Programmable cells can be programmed to switch between different states related to information stored by the cells (e.g. a high ohmic and a low ohmic state). The states can be reversible or irreversible such that the cell can switch between reversible states or into the irreversible state, but there should be no return possible from an irreversible (or non-reversible) state. One simple possibility to form an irreversible state is to set a flag, which blocks operations as, for example, the modification of the cell content.

Conventional cells with at least one irreversible state comprising said one time programming device or the logical obstruction, which blocks a rewriting of the device by setting a flag in a non-volatile memory.

Conventional one time programming (OTP) device may rely on different physical effects. Examples are fuses or electrically erasable programmable read-only memory (EEPROM) or flash memory cells, which are configured so that their content cannot be removed or erased or overwritten. The OTP device comprises two states, wherein in most cases one of the two states is irreversible, and the OTP cells are according to their name only programmable once. The flag of the OTP device may indicate that a specification of the individual integrated circuit (IC) is invalid. This specification is however still present implying that a potential attacker could in principle by circumventing this flag, again accessing the specification (for example by a physical bridging of the flag). An additional drawback of these known methods is the insufficient speed or time period, which is needed to program the OTP devices as well as the high-voltage needed for programming of fuses.

On the other hand, in case of a logical blocking against overwriting (locking) it is possible to program the cell multiple times before switching the cell into a locked state. This provides, however, only a logical protection, so that the security is, in general, not as high as for a physical protection. The locked state is moreover indistinguishable from the unlocked state or, in other words, additional information is required to distinguish between both states.

Embodiments of the present invention aim to provide a non-volatile fast programmable cell with irreversible states, which are—without physical action from outside—physically non-reversible. Hence, the irreversible state is not only blocked by a logical obstruction (for example by setting a specific flag) for changing the states. On the other hand, embodiments allow switching the cell between the two reversible states with almost no limitations with respect to the number of changes as long as the cell is not switched into the irreversible state or into one of its irreversible states.

Embodiments relate therefore to an electronic device comprising a circuitry and an asymmetric phase change memory cell comprising at least a first, a second and a third state. The asymmetric phase change memory cell is configured to allow switching from the third state into the first or into the second state in response to a signal comprising at least a predefined level. The circuitry is configured to provide a first and a second signal to the asymmetric phase change memory cell, wherein the first signal causes switching between the first and the second state and the second signal causes switching from the first or from the second state into the third state. The circuitry is configured to provide signals up to a maximum level, which is below the predefined level.

In contrast to conventional one time programming cells, embodiments define a cell that may physically be changed so that the cell may not be programmable anymore. The irreversible state can therefore be distinguished from the other two reversible states, which is not the case for conventional logical obstructions (for performing certain operations).

Another set of problems deals with the protection of the generation of a device specific bitstream $K_I$ (=key), which can be generated by an integrated circuit. Such circuits can, for example, be realized in terms of a so-called physically uncloneable function (PUF). A PUF circuit is employed, for example, in identification devices used to implement a secret key mutual authentication protocol. Said identification devices as, for example, RFID chips (RFID=Radio Frequency Identification) may be used for identifying the owner of the chip or the product to which the chip is connected. The physical uncloneable function comprises, for example, a circuit, which exploits chip-to-chip process variations and generates on the fly a volatile chip individual key.

The PUF offers a unique and unpredictable way of mapping challenges to responses (=the uncloneable function), although different PUFs may have been manufactured by the same process and may comprise the same devices. The uncloneability property is related to unavoidable manufacturing variations so that each device differs from another device in their electric characteristics. In silicon PUFs for example, the switching delays of transistors may deviate from each other, so that a simple time measurement for a signal propagating along different paths may differ from PUF to PUF in an unpredictable way. The manufacturing tolerances as, for example, layer thickness, doping levels, geometrical distances, etc. are namely controllable only up to certain accuracy. For example, there are no two transistors, whose threshold voltages are exactly the same. Due to this unpredictability, every PUF comprises its own challenge-response authentication.

A PUF-generated secret key guarantee therefore a higher security against cloning than a key programmed in a nonvolatile memory because tampering attempts will destroy the key.

Therefore, the PUF comprises, for example, the following properties:
(a) the uncloneability, implying that a potential attacker is unable to generate the same bitstream $K_I$ with an identical circuit, nor is he able to predict the integrated circuit-specific bitstream from his knowledge of the circuit;
(b) the uniqueness, meaning that the same circuit generates on each integrated circuit a different and, hence, device individual bitstream.

Therefore, an indistinguishable and uncloneable fingerprint is generated by the integrated circuit (in the broadest sense).

Embodiments of the present invention are also configured to destroy the physically uncloneable function irreversibly and quickly, respectively the device-specific key $K_I$. This operation ultimately terminates the lifecycle of the integrated circuit and, therewith destroys the access keys, ID-cards, passports, etc. To achieve this, embodiments use an asymmetric phase-change memory cell or programmable resistive elements comprising at least one irreversible state, so that the device is switched into the irreversible state in case an attack is detected, or in the case of a predetermined lifetime of an integrated circuit having expired.

Therefore, embodiments comprise also a security device comprising an asymmetric phase change memory cell (or in general a programmable resistive element) comprising at least a first, a second and a third state, wherein the asymmetric phase change memory cell is configured to allow switching from the third state into the first or into the second state in response to a signal comprising a predefined level. The security device comprises moreover a circuitry configured to provide a device individual bit stream and to proved a first and a second signal to the asymmetric phase change memory cell, wherein the first signal causes switching between the first and the second state and the second signal causes switching from the first or from the second state into the third state. The circuitry is further configured to provide signals up to a maximum level, which is below the predefined level, and wherein the circuitry is configured to block providing the bit stream in case the asymmetric phase change memory cell is within the third state.

Phase change memory (PCM or PCRAM) cells comprise a phase change material, which can be in a crystalline or amorphous phase. Correspondingly the PCM cell comprises at least two states, one high ohmic (amorphous) and one low ohmic (crystalline) state. Alternatively, the PCM cell may comprise two crystalline (low ohmic) and only one amorphous (high ohmic) state, or two crystalline and two amorphous states. The change between the states is initiated by different signals. For example, to switch from the amorphous to the crystalline state a long signal (set signal) with low current is needed (long enough that the atoms can form a crystal structure), whereas the switching from the crystalline to the amorphous phase is done be short signal (reset signal) with high current (after heating the cooling occurs quickly so that no crystal can be formed). Examples for the time period and the currents are: for the reset signal: about 100 . . . 800 µA for about 10 . . . 50 ns and for the set signal: about 50 . . . 150 µA for about 100 . . . 300 ns.

The phase-change memory cells are one of the best performing candidates for scaled non-volatile memories, as flash technologies face major scaling issues. During the programming of the PCRAM, both a high electrical current density and a steep temperature gradient occur. Due to the good electrical and poor thermal conductivity of Chalcogenide alloys as phase change material, strong thermo-electric effects are present.

For example, the Thomson Effect renders the temperature distribution along the phase-change material asymmetric (between both electrodes), since only part of the phase change material exhibits a temperature, which is above the melting temperature, and hence, which becomes amorphous by quenching. This amorphous portion is shifted within the phase-change material) by the thermo-electric effect. Due to the asymmetry of the cell, the Thomson-induced shift of the amorphous area results in different electrical performance when polarity is reversed.

Embodiments of the present invention comprise an asymmetric PCM memory cell (e.g. a T-Cell). These asymmetric phase-change memory cells comprise a crystalline state (the first state) and two amorphous states (the second and the third state), which differ in their resistance caused by the asymmetry with respect to the polarity (see below). The second state may comprise for example a lower resistance than the third state, so that the first and the second state comprise the reversible states, whereas the third state (e.g. with the highest resistance of the three states) comprise the irreversible state. In addition, in embodiments the phase change material of the asymmetric phase-change memory cell may comprise as phase change material, e.g., a chalcogenide or a chalcogenide alloy.

In embodiments the working voltage or the maximal current, which is implemented on the chip, is chosen such that switching between the first and second states (reversible states) are possible without limitations, i.e. a sufficient heating for the phase-change from the crystalline to the amorphous state can be achieved. But on the other hand, the working voltage (or current) is too low (or comprise the wrong polarity) to provide a sufficient heating for the third state (the high Ohmic amorphous state) so that phase change into the crystalline phase is excluded. In other words, the circuitry is configured such that the needed signal for this comprises a level will that will damage the circuitry.

In another embodiment, the electronic device comprises two crystalline states, wherein one of the crystalline states comprises a low Ohmic state that is irreversible and cannot be changed (over-written) after the device has switched into this state. Again the reason is that the device is unable to provide the needed signal for this phase change, since the electronic device is unable to provide a reset current to change this state.

In yet another embodiment, the electronic device comprises two irreversible states: one irreversible crystalline state and one irreversible amorphous state. These two irreversible states may be combined with one or two reversible states, wherein the resistances of the reversible states may be in between the resistances of the irreversible states, i.e. the state with the highest and lowest resistivity may comprise the irreversible states.

Therefore, embodiments use PCRAM-cells with at least three states, which are distinguishable by their electrical resistance, and hence may be read by a measurement of the resistance, which distinguished the three states. Embodiments comprise moreover a maximum programmable voltage, which is such that a state change out of one of the low Ohmic states is possible, but from the high Ohmic state (third state), is not.

In embodiments the asymmetric phase change memory needs for example a predefined level for switching from the third state into the first or second state comprises a predefined voltage or a predefined current or a predefined polarity, wherein the circuitry is unable to provide the predefined voltage or the predefined current or the predefined polarity.

In yet further embodiments the circuitry comprises a detector for detecting an unauthorized access (attack) of the circuitry or a means for processing. The asymmetric phase change memory cell is configured to switch into the third state in case the detector detects the unauthorized access. The detector can, e.g., send an alert signal to the circuitry, which controls the switching into the third state.

These PCRAM cells, can for example, be used:
for management of lifecycles of products such as smartcards;
to store an alert state after a successful attack on the security chip, in which case the high writing speed is important. Such devices can, for example, comprise security relevant static information, for instance keys used in cryptography. In the case of a detected attack, the asymmetric phase-change cell is put into the irreversible state, whereby the sensitive information is automatically erased; the attack is however monitored (e.g. for later inspection);
the devices can also be used for lock bits in order to provide a logical overwrite protection. When using embodiments the lock bits are, however, physically irreversible.

Embodiments comprise numerous advantages that can be summarized as follows. If the electronic device comprises a physically uncloneable function and the asymmetric phase-change memory cell is used to implement such PUF (for example in the low Ohmic state), then it is possible to destroy, quickly and efficiently, the device's individual characteristics. This can be achieved by switching the phase-change memory cell into the third, the so-called OTP state. In this case, the PUF is no longer able to generate the IC-individual characteristics (e.g. a key) used, for example, for identification. Since the change into the third state is physically not reversible, the individual characteristics are ultimately destroyed making, e.g., the identification device invalid and hence not usable for an unauthorized person.

Physically irreversible means that without physical action from outside (which may destroy the circuitry) it is impossible to change this state. Therefore, it is not only a logical obstruction to switch a state.

This physically irreversibility comprises already a major advantage of this realization, which is combined with the fast mechanism so that even under an attack condition the switching into the third state can still be performed. Also the low energy consumption is important to perform the switching into the third state even during the attack (no charge pumping is needed). Hence, the programming of the non-volatile PCM cells is especially fast (in comparison to flash or EEPROM devices) and this property is important to interrupt the attack already at a very early stage so that the damage can be limited.

Since further embodiments also comprise phase-change memory cells (or programmable resistive elements) comprising more than one irreversible state (e.g. a fourth state), it is possible that the different OTP states (the irreversible states) can be used in order to code additional information. It can for example be used to identify the circumstances under which the individual characteristics have been destroyed. It is also possible to use an asymmetric phase-change memory cell comprising more than two reversible states, which are also known as multilevel devices.

FIG. 1 shows a schematic view of an electronic device comprising a programmable resistive element 110 and a circuitry 120, which are electrically connected. The circuitry 120 is configured to provide a switch signal to the programmable resistive element 110 and the programmable resistive element 110 comprises a first and a second state, and is configured to allow switching from the second state into the first state in response to a signal comprising at least a predefined level. The predefined level can for instance comprise a predefined voltage, a predefined current, a predefined time, or a predefined polarity. The circuitry 120 is configured such that the switch signal causes a switching from the first into the second state. The circuitry 120 is further configured to provide signals only up to a maximum level (e.g. a maximal voltage $V_{max}$ or a maximal current $I_{max}$), which is below the predefined level and, hence, the second state becomes an irreversible state, since the circuitry 120 is unable to provide a signal of the predefined level.

In other words, the circuitry 120 is configured such that a signal comprising the predefined level may damage the circuitry 120 itself. The predefined level may comprise, e.g., a voltage which exceeds the working voltage of the circuitry 120, or when the predefined level comprises a current, which exceeds a maximum current allowable within the circuitry. The predefined level may also correspond to a specific polarization, which the circuitry is not adapted for.

Embodiments use for the programmable resistive element may comprise phase-change memory cell (comprising at least two states), asymmetric phase-change memory cell (comprising at least three states), CBRAM, metal oxide, etc. Phase-change memory cells are explained above and asymmetric phase-change memory cells will be described below in more detail. CBRAM (conductive-bridging RAM) use, for example, an electrolyte between two different metal electrodes in order to form ion-bridges between the metal in one polarization, which disappear in the opposite polarization. These ion-bridges change significantly the resistance between both electrodes, so that the high ohmic state corresponds to the absence of ion-bridges, whereas in the low ohmic state ion bridges are formed. Therefore, in case of CBRAMs the signal of predefined level needs an opposite polarity than the switch signal and according to embodiments the circuitry is unable to provide the polarity related to the predefined level (alternatively this polarity may damage or destroy the circuitry or its functionality). Said asymmetry can also be achieved by using materials comprising metal oxides as, for example, NiO.

Figure 2A:
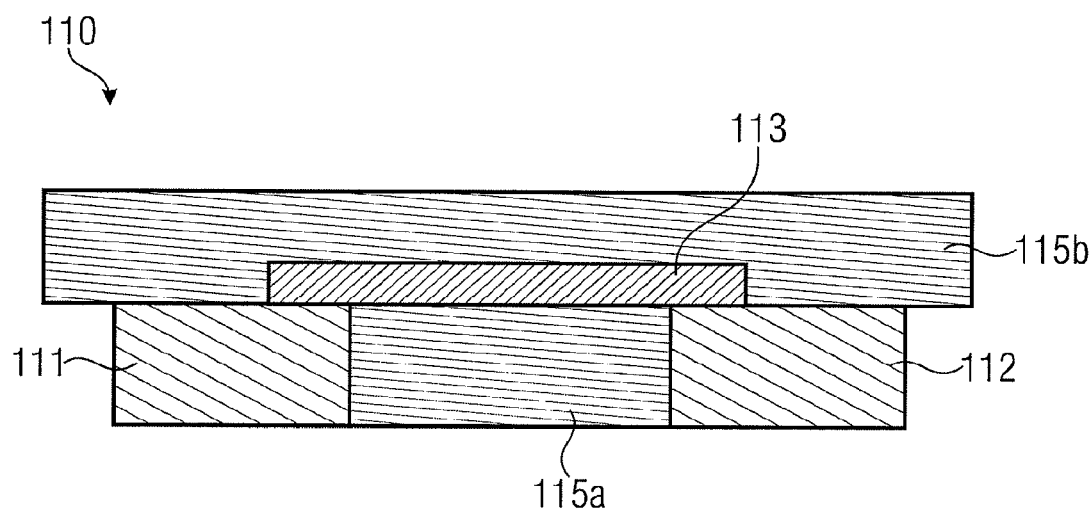
FIGS. 2a and 2b show a cross-sectional and an overview of an asymmetric phase-change memory cell.
Figure 2B:
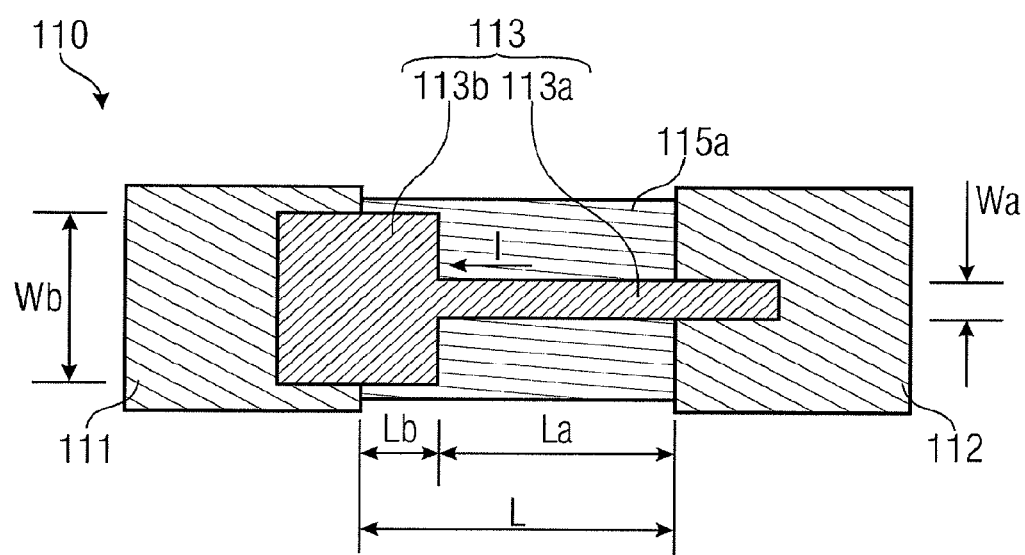

FIGS. 2a and 2b show views of the asymmetric phase-change memory cell 110 comprising a first electrode 111 and a second electrode 112 connected by a phase-change material 113.

As the cross-sectional view of FIG. 2a shows, between the first and second electrode 111 and 112, a first portion of a dielectric layer 115a is arranged and a second portion of the dielectric layer 115b is arranged on the phase-change material 113, and on the first electrode 111 and on the second electrode 112.

FIG. 2b shows an overview of the asymmetric phase-change memory cell 110 of FIG. 2a, viewed from the side of the second portion of the dielectric layer 115b, which is not shown in this FIG. 2b. Only the first portion of the dielectric layer 115a underneath the phase-change material 112 is visible. Again, the phase-change material 113, whose asymmetric form is visible in this overview, bridges the first electrode 111 and the second electrode 112. If a voltage is applied between the first and the second electrode 111,112 an electric current along a current path I may be generated and the asymmetric form of the phase-change material is such that the cross-sectional area perpendicular to the current path changes along the current path. In the embodiments as shown in FIG. 2b the phase-change material comprise a T-shape (defining a T-cell), wherein the cross section of the phase change material 113 increases from the second electrode 112 to the first electrode 111.

As consequence, the phase-change material 113 comprises a T-shape in that the phase-change material 113 comprises a small region 113a (with a smaller cross-sectional area) and an enlarged region 113b (with an increased cross-sectional area). The first and second electrode 111, 112 are separated by a distance L, which is bridged by the phase-change material 113 such that along the second portion of the dielectric layer 113b the small region 113a extends over a first length La with a first width Wa, and the enlarged region 113b extends over a second length Lb with a second width Wb. The T-shape implies that the first electrode 111 is contacted over a smaller portion and that the second electrode is contacted over an enlarged portion perpendicular to the current path I.

It is also possible to achieve the first and second cross-sectional area by means of a funnel like shape in vertical direction.

The first length La may, for example, comprise a value between 100 nm and 800 nm, and the first width may comprise a minimal value between 10 nm and 100 nm or between 20 nm and 80 nm.

Figure 3A:
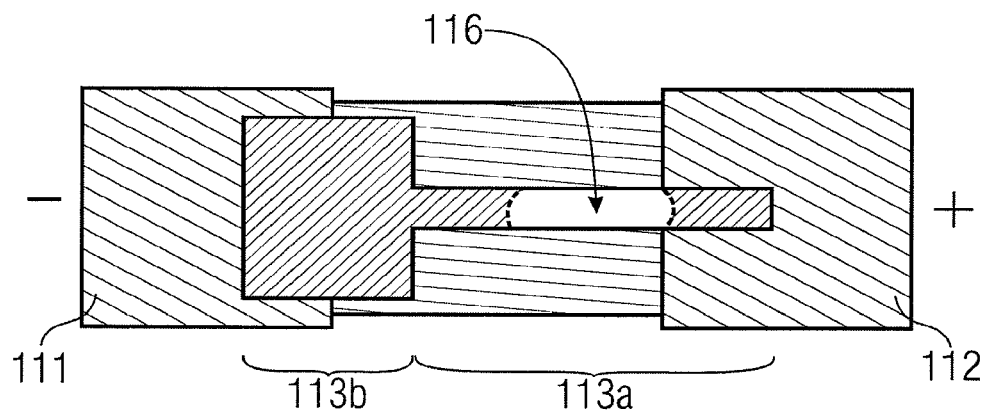
FIGS. 3a and 3b show the asymmetric phase-change memory cell with shifted amorphous regions.
Figure 3B:
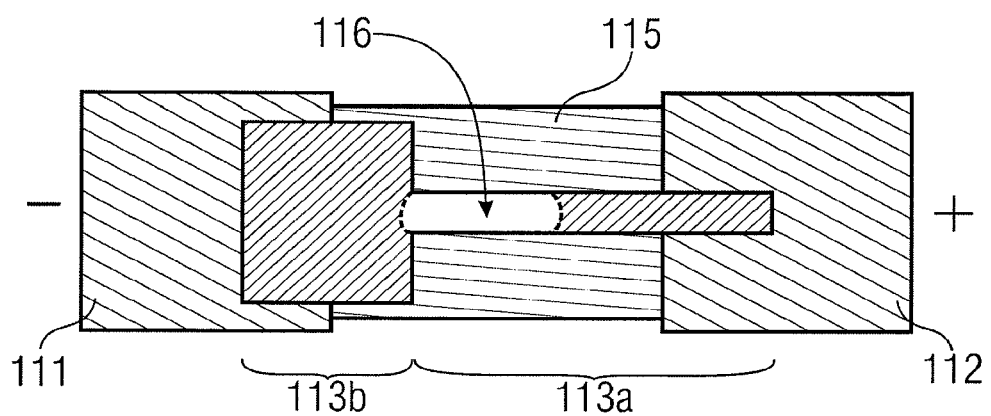

FIGS. 3a and 3b show the different amorphous phases related to the second and third state, which are distinguished by the polarity at the first electrode 111 and the second electrode 112 (there may again a dielectric layer 115 be arranged between the first electrode 111 and the second electrode 112). The different amorphous phases are related to different regions, in which the crystalline phase-change material 113 becomes an amorphous region 116.

By applying a reset signal (e.g. the first or the second signal) the phase-change material 113 exhibits a phase-transition from a crystalline phase (with a small amount of resistance) to the amorphous phase. The amorphous phase is however not formed along the whole phase-change material 113, but only within the amorphous region 116, whose position depends on the polarity between the first electrode 111 and the second electrode 112. This shift of this amorphous region 116 is due to the Thomson Effect, which causes a shift in the temperature gradient in the presence of an electric current along the phase-change material 113. This shift is towards the electrode with the +polarity and if the phase-change material 113 is asymmetric between the first and second electrodes 111, 112, this results into different (distinguishable) amorphous phases.

In addition to the shift of the position of the amorphous region 116 also the volume of the amorphous region may differ. Since the amorphous phase exhibits a higher resistance the crystalline phase, an increased volume of the amorphous region 116 may yield an increased resistance.

FIG. 3a shows an embodiment, wherein the amorphous region 116 is formed closer to the second electrode 112 as an anode (+polarity) and defines the third state (irreversible state). In comparison, in FIG. 3b the polarity is switched resulting to the amorphous region 116 being formed closer to the first electrode 111 as anode, which defines the second state (reversible state).

In other embodiments the small region 113a of the phase-change material 113 may connect the first electrode 111 and the enlarged region 113b of the phase-change material 113 may connect the second electrode. In this embodiment, the polarity of FIG. 3a would give the second state, whereas the polarity of FIG. 3b would give the third state.

As explained above the temperature gradient fixes the position of the amorphous region 116 and is generated by the reset current passing the amorphous material 113. The three states realized in the phase-change material 113 are the crystalline phase with a low resistance and the two amorphous phases related to shifts of the amorphous region 116 (cp. FIGS. 3a and 3b). The switch from the crystalline phase to the amorphous phases is the reset state and the switch from the amorphous phases to the crystalline phase is the set state.

In addition to the embodiment as shown in FIGS. 3a and 3b, in an alternative embodiment the amorphous and crystalline phases are exchanged, i.e. the amorphous material 113 is in an amorphous phase and the regions 116 in comprise the crystalline phase. In this embodiment two crystalline phases, related to different positions and/or volumes of the region 116, are combined with one amorphous phase, in which the whole phase-change material 113 is amorphous. Also in this embodiment the two crystalline phases comprise different resistances, e.g. caused by different volumes of the crystalline (low ohmic) region 116, which in this case are both lower than the resistance of the amorphous phase. Hence, the irreversible state may in this embodiment the state with the lowest resistance or the one, which needs the biggest level signal to switch into the amorphous state.

Figure 4:
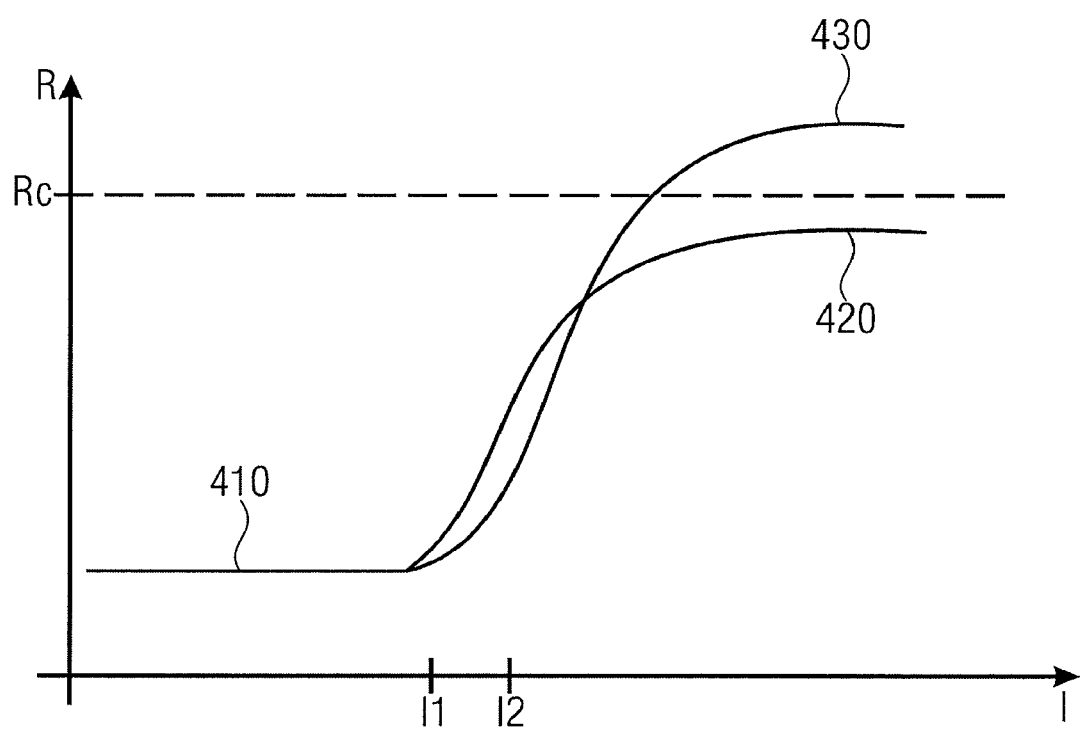
FIG. 4 shows a dependence of the resistance on a reset current.

FIG. 4 shows the dependence of the reset resistance as a function of the reset current. These graphs may be obtained by taking medium values over samples of T-cells, for example, with the first width Wa of 110 nm and a first length La of 460 nm. Both graphs may be related to different polarities applied to the phase change memory cell.

FIG. 4 shows in detail two graphs, for example one of an N+ polarization showing the transition from the first state 410 to the third state 430, and the other for the N− polarization showing the transition from the first state 410 to the second state 420. The N+ polarization corresponds to the case as shown in FIG. 3a, and the N− polarization corresponds to the case as shown in FIG. 3b. The phase transition between the first state 410 and the second state 420 (with N− polarity) occurs at a first current I1, at which the reset resistance starts to grow rapidly. On the other hand, the phase transition between the first state 410 and the third state 420 (with N+ polarity) occurs at a second current I2, at which again the reset resistance starts to grow rapidly.

Therefore, FIG. 4 shows three states, one state (the first state 410) with a low Ohmic resistance (e.g. a crystalline state) and two high Ohmic states, the second state 420 and the third state 430. In addition, FIG. 4 shows that the third state 430 exceeds a resistance level Rc, which is such that a set is no longer possible (no return to the crystalline phase). This impossibility to switch the third (amorphous) state 430 back to the crystalline state 410 is, e.g., due to the fact that a possible set signal would exceed a level (voltage or current and/or polarity), which can be provided by the corresponding circuitry 120.

Figure 5:
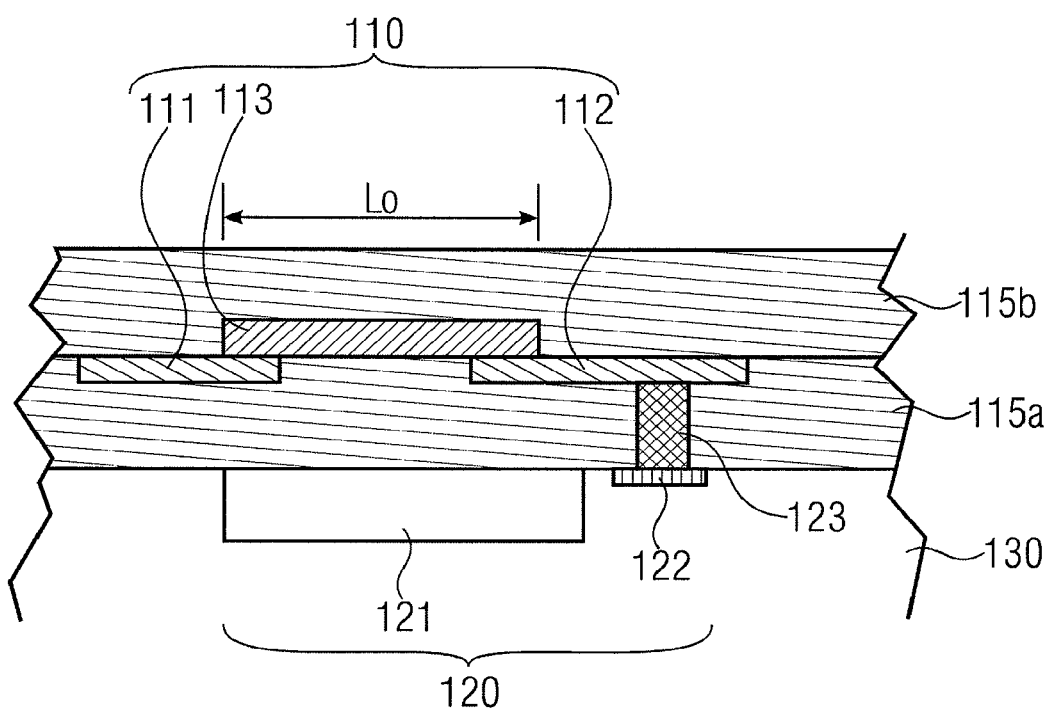
FIG. 5 shows an MOS-device comprising the asymmetric phase-change memory cell.

FIG. 5 shows an embodiment for an electronic device with the phase-change memory cell 110 arranged within a dielectric layer structure 115 of a MOS-device (MOS=Metal Oxide-Semiconductor). In FIG. 5 the circuitry 120 (which may also comprise a configurable module) is formed in a substrate 130, which may for example comprise silicon and doped regions within the silicon. The circuitry 120 comprises, for example, a first part 121 which may comprise a doped region within the semiconductor and a contact region 122. A dielectric layer structure 115 comprising a first part 115*a* and a second part 115*b* is formed on the substrate 130. Within the dielectric layer structure 115 conductive layer are arranged, wherein two of these conductive layers are used as the first and the second electrode 111, 112 of the PCM-cell 110. The first electrode 111 and the second electrode 112 are electrically connected by the phase material 113 comprising a length L0.

The contact region 122 is contacted by a via contact 123 providing an electric connection between the contact region 122 and the second electrode 112, and which is arranged between the first part and second part 115*a* and 115*b* of the dielectric layer structure 115. In addition, the first electrode 111 is also arranged between the first and second part of the dielectric layers 115*a* and 115*b*. The phase-change material 113 may comprise a symmetric or the asymmetric shape as shown in FIG. 2*b*, when viewed from the topside (opposite to the substrate 130).

Arranging the asymmetric phase-change memory cell 110 within the dielectric layer structure 115 of the MOS-device provides the possibility of hiding the functionality of the phase-change memory cell 110. This comprises a major advantage, which is especially important for security-related devices, wherein concrete connections and switching behavior between different devices should remain hidden.

In further embodiments the phase-change memory cell 110 is replaced by an OTS-cell, which optionally may be part of a logic circuit realized in part in the substrate 130.

Embodiments comprise also a method for manufacturing an MOS device, comprising a forming of the asymmetric phase-change memory cell formed within the dielectric layer structure and a connecting the asymmetric phase-change memory cell a semiconductor device in a substrate (comprising for example silicon).

Further embodiments comprise a method for blocking an electronic device comprising a programmable resistive element (or an asymmetric phase change memory cell) and a circuitry, wherein the programmable resistive element (or an asymmetric phase change memory cell) comprises a first, a second and a third state. The method comprises a switching between the first, the second, and the third state, wherein switching from the third state into the first or into the second state is performed in response to a signal comprising at least a predefined level. The method further comprising a providing a first and a second signal by the circuitry, wherein the first signal causes switching between the first and the second state and the second signal causes switching from the first or from the second state into the third state, wherein the circuitry is configured to provide signals up to a maximum level, which is below the predefined level.

The invention claimed is:

1. An electronic device comprising:
a programmable resistive element comprising at least a first state and a second state, wherein the programmable resistive element is configured to allow switching from the second state into the first state in response to a signal comprising at least a predefined level; and
a circuitry for providing signals below the predefined level, wherein the circuitry is configured to provide a switch signal to the programmable resistive element, wherein the switch signal causes switching from the first into the second state,
wherein the programmable resistive element further comprises a third state and a memory material such that the second and the third state comprise both high ohmic states of the memory material with different resistances, and
wherein the programmable resistive element further comprises a fourth state, and wherein the circuitry is configured to provide a further switch signal to switch from the first state into the fourth state, wherein the fourth state is irreversible in that the circuitry is unable to provide a signal to switch from the fourth state into the first state or into the third state.

2. The electronic device of claim 1, wherein the programmable resistive element is configured such that the predefined level comprises a predefined voltage or a predefined current or a predefined polarity or a predefined time, and wherein the circuitry is unable to provide the predefined voltage or the predefined current or the predefined polarity.

3. The electronic device of claim 1, wherein the circuitry is configured to provide signals for switching between the first and the third state.

4. The electronic device of claim 3, wherein the predefined level comprises a predefined voltage, and wherein the programmable resistive element comprises a fourth state comprising a further state of the memory material and wherein the programmable resistive element is configured to allow switching from the fourth state into the first or into the third state in response to a signal comprising at least the predefined level.

5. The electronic device of claim 1, wherein the programmable resistive element comprises a T-cell.

6. The electronic device of claim 1, wherein the programmable resistive element comprises a funnel like shape.

7. The electronic device of claim 1, wherein the circuitry is configured to provide only signals below the predefined level.

8. The electronic device of claim 1, wherein the programmable resistive element comprises a metal oxide.

9. An electronic device comprising:
a programmable resistive element comprising at least a first state and a second state; and
a circuitry for providing a switch signal to switch the programmable resistive element from the first state into the second state,
wherein the circuitry is unable to provide a signal to switch the programmable resistive element from the second state into the first state,
wherein the programmable resistive element further comprises a third state, the first state and the third state are reversible states in that the circuitry is able to provide signals to switch between the first state and the third state, and
wherein the programmable resistive element further comprises a fourth state, and wherein the circuitry is configured to provide a further switch signal to switch from the first state into the fourth state, wherein the fourth state is irreversible in that the circuitry is unable to provide a signal to switch from the fourth state into the first state or into the third state.

10. The electronic device of claim 9, wherein the programmable resistive element comprises a memory material such that the first state, the second state, the third state, and the fourth state comprise different resistances, wherein the fourth state comprise a lowest resistance and the second state a highest resistance, and wherein the first state comprise a lower resistance than the third state.

11. The electronic device of claim 10, wherein the memory material is a phase change material, wherein both, the first state and the fourth state comprise different crystalline phases, and wherein both, the second state and the third state comprise different amorphous phases.

12. The electronic device of claim 9, wherein the programmable resistive element comprises an asymmetric phase change memory cell.

* * * * *